(12) United States Patent
Lin et al.

(10) Patent No.: US 8,779,555 B2
(45) Date of Patent: Jul. 15, 2014

(54) PARTIAL SOI ON POWER DEVICE FOR BREAKDOWN VOLTAGE IMPROVEMENT

(71) Applicant: Taiwan Semiconductor Manufacturing Co. Ltd., Hsin-Chu (TW)

(72) Inventors: Long-Shih Lin, Zhubei (TW); Fu-Hsiung Yang, Zhongli (TW); Kun-Ming Huang, Taipei (TW); Ming-Yi Lin, Hsin-Chu (TW); Po-Tao Chu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/706,975

(22) Filed: Dec. 6, 2012

(65) Prior Publication Data

US 2014/0159103 A1    Jun. 12, 2014

(51) Int. Cl.
*H01L 29/739*    (2006.01)
*H01L 29/34*    (2006.01)

(52) U.S. Cl.
USPC .... 257/619; 257/170; 257/409; 257/E27.004; 257/E29.187

(58) Field of Classification Search
None
See application file for complete search history.

(56) References Cited

U.S. PATENT DOCUMENTS

| | | | | |
|---|---|---|---|---|
| 5,004,705 A * | 4/1991 | Blackstone | | 438/455 |
| 5,036,021 A * | 7/1991 | Goto | | 438/355 |
| 5,776,813 A * | 7/1998 | Huang et al. | | 438/309 |
| 5,807,783 A * | 9/1998 | Gaul et al. | | 438/406 |
| 6,265,752 B1 * | 7/2001 | Liu et al. | | 257/487 |
| 6,486,034 B1 * | 11/2002 | Huang et al. | | 438/281 |
| 6,500,717 B2 * | 12/2002 | Goodwin et al. | | 438/296 |
| 7,067,887 B2 * | 6/2006 | Chang et al. | | 257/360 |
| 7,508,032 B2 * | 3/2009 | Chiang et al. | | 257/345 |
| 7,768,071 B2 * | 8/2010 | Huang et al. | | 257/355 |
| 7,955,969 B2 * | 6/2011 | Kinzer et al. | | 438/629 |
| 8,129,783 B2 * | 3/2012 | Huang et al. | | 257/339 |
| 2002/0041003 A1 * | 4/2002 | Udrea et al. | | 257/502 |
| 2004/0178443 A1 * | 9/2004 | Hossain et al. | | 257/328 |
| 2005/0242369 A1 * | 11/2005 | Udrea et al. | | 257/107 |
| 2005/0282306 A1 * | 12/2005 | Yamanaka | | 438/57 |
| 2006/0022263 A1 * | 2/2006 | Haase et al. | | 257/328 |
| 2006/0197156 A1 * | 9/2006 | Amaratunga et al. | | 257/347 |
| 2007/0252243 A1 * | 11/2007 | Ohmi et al. | | 257/628 |

(Continued)

OTHER PUBLICATIONS

Luo, X.R. A High Voltage Silicon-on-insulator Lateral Insulated Gate Bipolar Transistor with a Reduced Cell-Pitch, Chin. Phys. B. vol. 22, No. 2 (2013) pp. 027303.*

(Continued)

*Primary Examiner* — Thomas L Dickey
*Assistant Examiner* — Joseph Schoenholtz
(74) *Attorney, Agent, or Firm* — Eschweiler & Associates, LLC

(57) ABSTRACT

The present disclosure relates to a method and apparatus to increase breakdown voltage of a semiconductor power device. A bonded wafer is formed by bonding a device wafer to a handle wafer with an intermediate oxide layer. The device wafer is thinned substantially from its original thickness. A power device is formed within the device wafer through a semiconductor fabrication process. The handle wafer is patterned to remove section of the handle wafer below the power device, resulting in a breakdown voltage improvement for the power device as well as a uniform electrostatic potential under reverse biasing conditions of the power device, wherein the breakdown voltage is determined. Other methods and structures are also disclosed.

9 Claims, 11 Drawing Sheets

(56) References Cited

U.S. PATENT DOCUMENTS

2012/0068311 A1* 3/2012 Yamazaki ............... 257/619
2012/0104554 A1* 5/2012 Eden et al. ............. 257/586
2012/0119318 A1* 5/2012 Tokura et al. .......... 257/489

OTHER PUBLICATIONS

Bertrand, I., et. al., "New Lateral DMOS and IGBT Structures Realized on a Partial SOI Substrate Based on LEGO Process", IEEE BCTM 5.2 (2005).*

Tee, E., "200V Superjunction n-type Lateral Insulated Gate Bipolar Transistor with Improved Latch-up Characteristics", IEEE Transactions on Electron Devices, vol. 60, No. 4, (Apr. 2013) pp. 1412-1515.*

Beggans, M. "Ultrathin Silicon Wafer Bonding: Physics and Applications", Diss., Federated Physics Department, New Jersey Institute of Technology May 2001.*

Radhakrishnan Sithanandam, et al.; "Linearity and Speed Optimization in SOI LDMOS Using Gate Engineering"; Semiconductor Science and Technology; IOP Publishing 2010; p. 1-7.

B. Bakeroot, et al.; "Using Adaptive Resurf Technique and Field Plate Working to Improve the Safe Operating Area of n-type Drain Extended MOS Transistor"; ELIS-TFCG/IMEC, University of Gent, Nanotech 2011 vol. 1, p. 1-4.

Taylor Efland, et al.; "An Optimized RESURF LDMOS Power Device Module Compatible with Advanced Logic Processes"; Texas Instruments Incorporated; 1992 IEEE; p. 9.4.1-9.4.4.

* cited by examiner

PARTIAL SOI ON POWER DEVICE FOR BREAKDOWN VOLTAGE IMPROVEMENT

BACKGROUND

Ultra-high voltage (UHV) metal oxide semiconductor field-effect transistor (MOSFET) devices are utilized in integrated circuits mainly for switching applications due to their high efficiency relative to other power semiconductor devices such as insulated gate bipolar transistors and thyristors. Breakdown voltage of a UHV MOSFET device is related to a thickness of a layer of buried oxide (BOX) which surrounds the UHV MOSFET device, as well as wafer thickness. Increasing the BOX thickness to increase breakdown voltage can increase defect densities and reduce manufacturing throughput.

DETAILED DESCRIPTION

Figure 1:
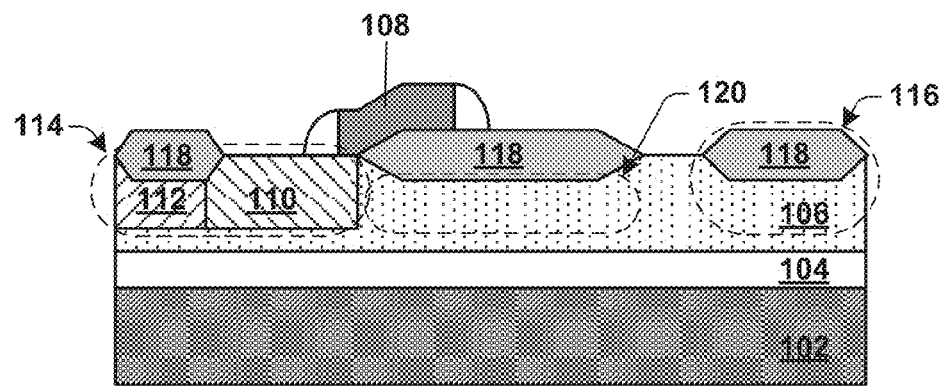
FIG. 1 illustrates some aspects of an ultra-high voltage (UHV) metal oxide semiconductor field-effect transistor (MOSFET) power device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates some aspects of an ultra-high voltage (UHV) metal oxide semiconductor field-effect transistor (MOSFET) power device 100 formed on a bonded wafer. The bonded wafer comprises a handle wafer 102 and a device wafer 106 bonded by an intermediate oxide layer 104. The UHV MOSFET device 100 comprises a laterally diffused metal oxide semiconductor field-effect transistor (LDMOS) power device or a Lateral Insulated Gate Bipolar Transistor (LIGBT), configured to support elevated voltage conditions over associated logic devices for a given integrated circuit (IC) application. In this disclosure, a LIGBT 100 is used as an example for the UHV MOSFET device 100. A gate 108 is formed above an active channel region 120 of the LIGBT power device 100. A source 114 comprising a first well 110 further comprising a first conductivity of a first type (e.g., p-type) and a second well 112 further comprising a second conductivity of a second type (e.g., n-type) are located adjacent the gate. The LIGBT power device 100 further comprises a drain 116, and a layer of field oxide (FOX) 118 configured to isolate the gate 108, the source, 114, and the drain 116 from unintended effects of UHV biasing.

The LIGBT power device 100 is utilized for such applications as System on Chip (SoC) ICs. SoC technology achieves system-level functionality on a single chip by integrating logic and analog fabrication processes. Cost-effective SoC technology requires low cost high-performance power devices to drive multiple loads supporting multiple power domains within an SoC with a safe operating area (SOA) of approximately 10 V to approximately 20 V. This type of drive may be achieved with a charge pump device, which requires additional process complexity and added cost. The LIGBT power device 100 can also achieve the desired voltages needed for SoC applications but are subject to dielectric breakdown above a breakdown voltage of the LIGBT power device 100. A breakdown voltage (i.e., a maximum voltage which LIGBT power device 100 can sustain without acting as a conductor, resulting from dielectric breakdown of the device wafer 106) is dependent upon a thickness of buried oxide (BOX) which isolates the LIGBT power device 100 within the device wafer 106, as well as a thickness of the device wafer 106 itself. Increasing the BOX thickness can increase breakdown voltage, but may also have unintended effects such as increasing defect densities within the LIGBT power device 100 as well as reduce overall manufacturing throughput.

Accordingly, the present disclosure relates to a method and apparatus to increase breakdown voltage of a semiconductor power device. A bonded wafer is formed by bonding a device wafer to a handle wafer with an intermediate oxide layer. The device wafer is thinned substantially from its original thickness. A power device is formed within the device wafer through a semiconductor fabrication process. The handle wafer is patterned to remove section of the handle wafer below the power device, resulting in a breakdown voltage improvement for the power device as well as a uniform electrostatic potential under reverse biasing conditions of the power device, wherein the breakdown voltage is determined. Other methods and structures are also disclosed.

Figure 2A:
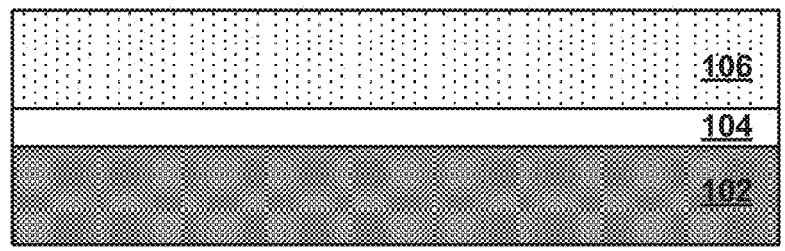
FIGS. 2A-2L illustrate some embodiments of power device formation on a bonded wafer for breakdown voltage improvement.

FIGS. 2A-2L illustrate some embodiments of power device formation on a bonded wafer for breakdown voltage improvement. FIG. 2A illustrates a bonded wafer 200A formed by oxidizing a surface of a device wafer 106 to create an intermediate oxide layer 104, flipping the device wafer 106, and bonding the device wafer 106 to a handle wafer 102 with the intermediate oxide layer 104. The device wafer 106 is thinned from its original thickness of approximately 20 μm to a thickness of approximately 5 μm. An area of a power device is laterally isolated using dielectric trench isolation structures and BOX isolation comprising the intermediate oxide layer 104 to prevent current leakage from the power device.

Figure 2B:
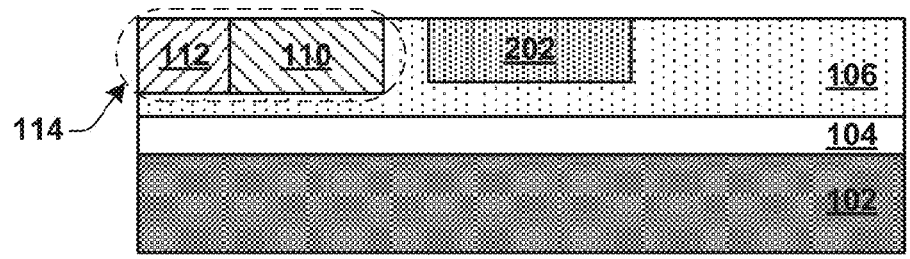

FIG. 2B illustrates a bonded wafer 200B with wells disposed in a surface region of the device wafer 106. In some embodiments, the device wafer 106 comprises a lightly-doped p-type substrate. A first well 110 comprising a first conductivity of a first type is disposed within a source 114 of the device wafer 106 through diffusion, implantation, or a combination thereof. For the embodiments of FIGS. 2A-2L, the first conductivity of the first type comprises p-type conductivity, wherein the first well 110 is doped with boron. A second well 112 comprising a second conductivity of a second type (e.g., n-type conductivity) is disposed within the source 114 through phosphorus doping. A RESURF (REduced SURface Field) technique utilizes arsenic doping of a near surface region of the device wafer 106 to create a p-type ring, or "p-ring" 202, which reduces potential crowding under a gate oxide, and increases breakdown voltage.

Figure 2C:
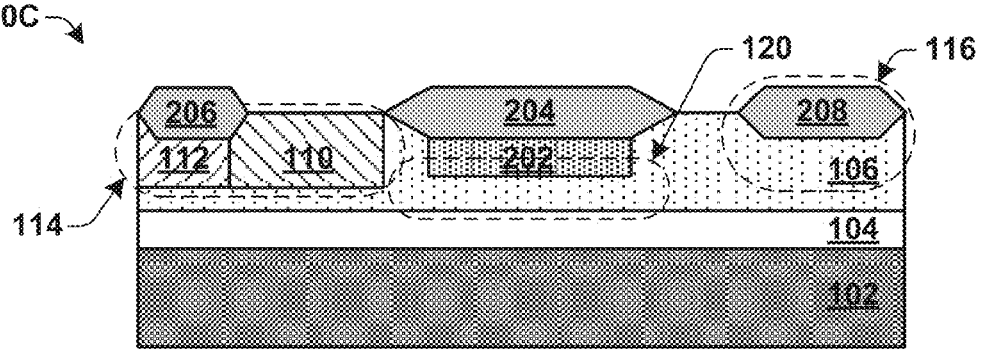

FIG. 2C illustrates a bonded wafer 200C deposited with a field oxide (FOX) or field plate for device terminal isolation in the presence of elevated voltage conditions. A first field oxide layer 206 (e.g., TEOS) is disposed above the source 114 and configured to isolate the source 114 from an electric potential applied to the source 114. A second field oxide layer 208 is disposed above a drain 116 in a region opposite the p-ring 202 of the first field oxide layer 206, and configured to isolate the drain 116 from an electric potential applied to the drain 116. A third field oxide layer 204 is disposed above the p-ring 202 and is formed as a field plate to increase the breakdown voltage.

Figure 2D:
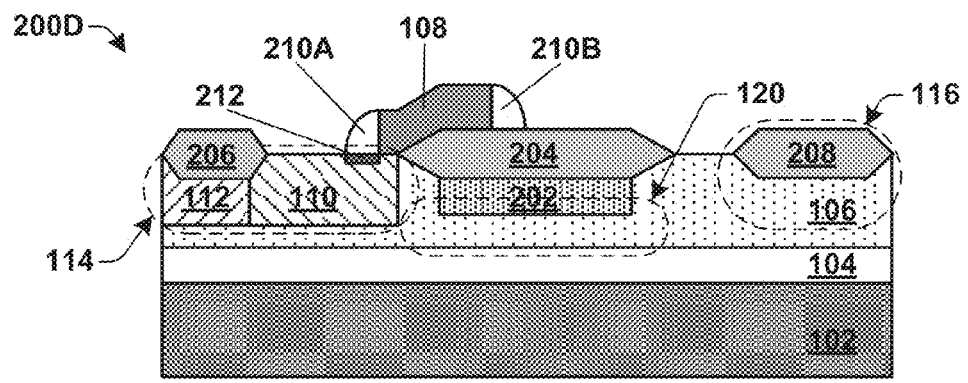

FIG. 2D illustrates power gate formation on a bonded wafer 2000. To mitigate hot carrier effects from the source 114, an n-type lightly-doped drain 212 is implanted into the first well 110. A gate 108 is deposited over a portion of the third field oxide layer 204 and over a portion the first well 110, with a first spacer 210A covering the n-type lightly-doped drain 212 and a second spacer 210B on an opposite side of the gate 108.

Figure 2E:
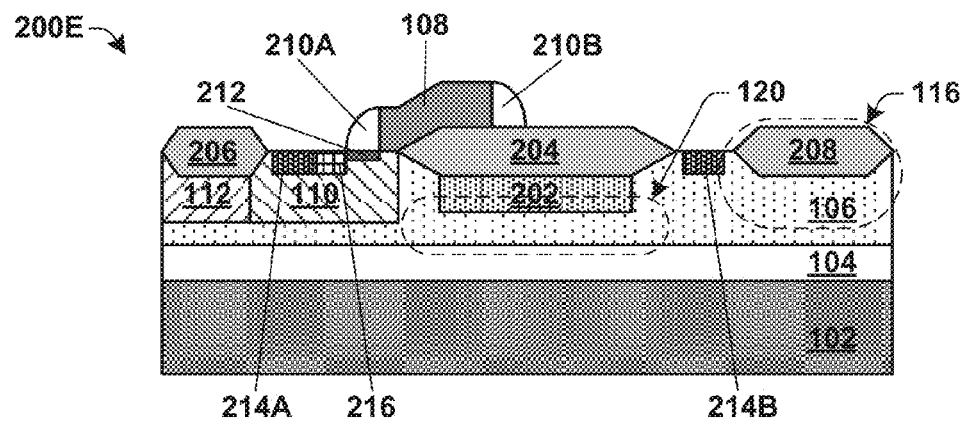

FIG. 2E illustrates a power device structure 200E disposed on a bonded wafer. The power device structure 200E is fabricated by doping of the wells formed in FIG. 2B and the drain 116 through ion implantation. The first well 110 comprises a first excess of carriers of a first type (e.g., holes) to create a first doped region adjacent the first field oxide layer 206. A first doped region 214A comprising a first excess of carriers of a first type is disposed within the first well 110 adjacent the first field oxide layer 206. A second doped region 216 comprising a second excess of carriers of a second type (e.g., electrons) is also disposed within the first well 110 adjacent the gate 108 via ion implantation. A third doped region 214B comprising an excess of carriers of the first type is disposed within the drain 116.

Figure 2F:
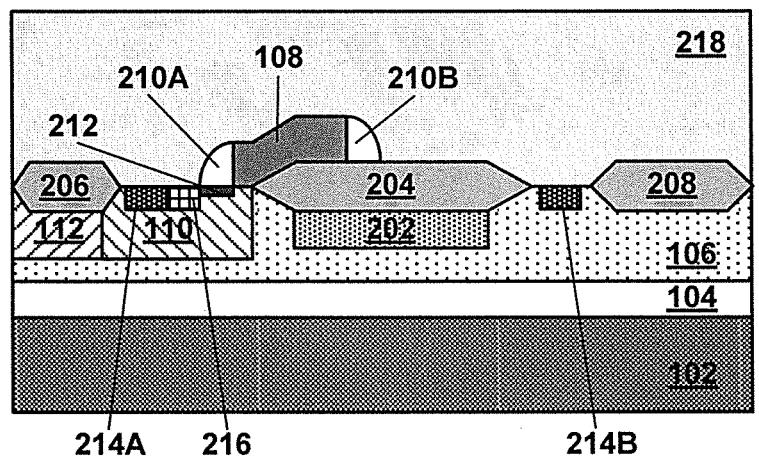
Figure 2G:
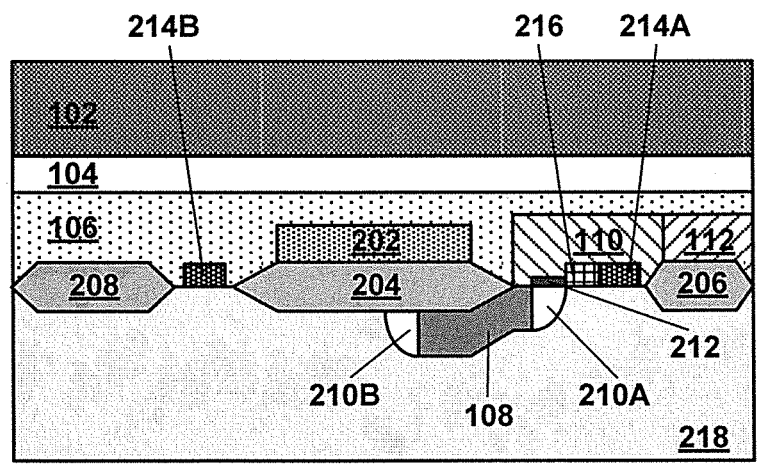
Figure 2H:
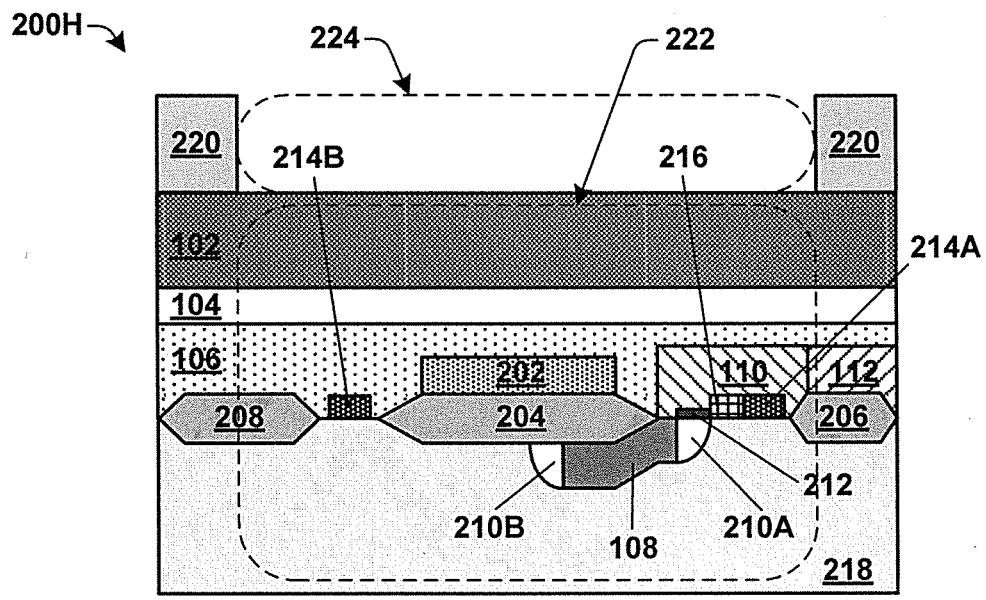
Figure 2I:
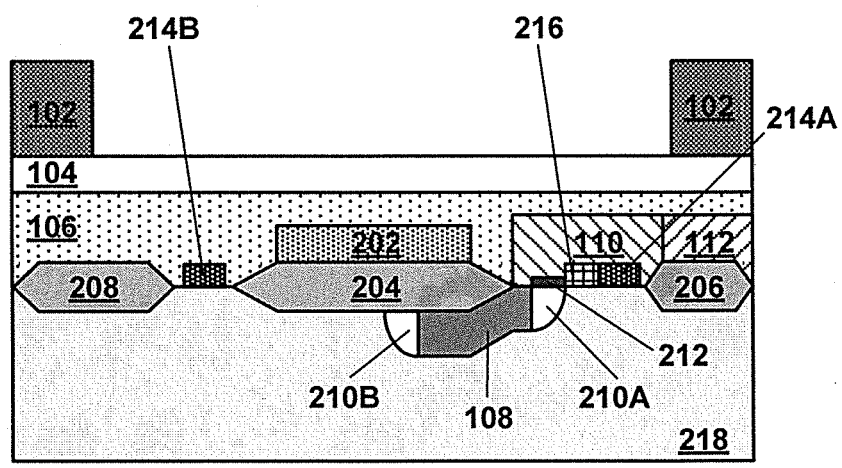
Figure 2J:
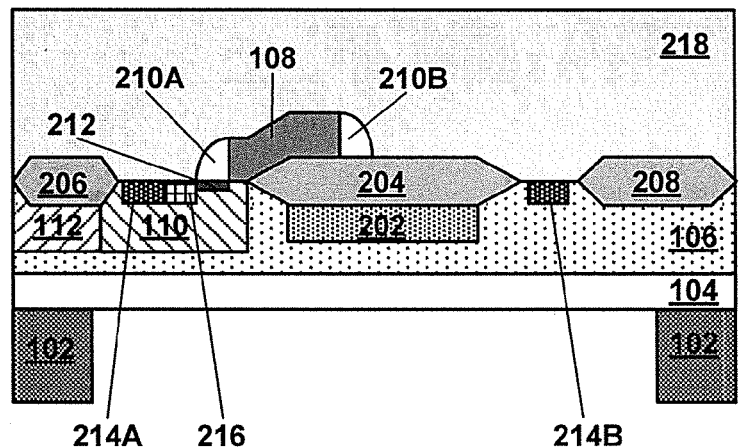

Upon completion of the power device structure 200E, an inter-layer dielectric (ILD) 218 is formed to isolate the device wafer 106 surface and power device from an ambient environment, as shown in FIG. 2F. FIG. 2G illustrates flipping of the bonded wafer containing a fabricated power device 2000 for selective removal of sections of the handle wafer 102. For the embodiments of FIGS. 2A-2L, a region of the handle wafer 102 below the power device 2000 is completely removed. In subsequent embodiments only a portion of the region below the power device 200G is removed. FIG. 2H illustrates some embodiments of handle wafer removal 200H for a power device. The surface of the handle wafer 102 is coated with photoresist 220 (e.g., positive photoresist) with a spin-coating apparatus, and aligned with a photomask containing a pattern that comprises an opening above a region of the handle wafer surface below a power device 222. The coated surface of the handle wafer 102 is exposed to illumination to transfer the opening to the photoresist 220, and the pattern is etched into the surface of the handle wafer 102 using the intermediate oxide layer as an etch stop, creating a recess 224 within the handle wafer 102, the recess 224 comprising a removed section of the handle wafer 102 and resides within a vicinity of the power device 222. For the embodiments of FIGS. 2A-2L, the recess 224 comprises a section of the handle wafer 102 above the power device 222 is essentially fully removed. Note that in a regular orientation the section of the handle wafer 102 that is essentially fully removed resides below the power device 222. To avoid confusion it may be said that the section of the handle wafer 102 that is essentially fully removed resides over the power device 222, regardless of the orientation, as is enforced through Boolean interaction layout restrictions. The photoresist 220 is removed as shown in FIG. 2I, and bonded wafer is flipped back to its original orientation as shown in FIG. 2J.

Figure 2K:
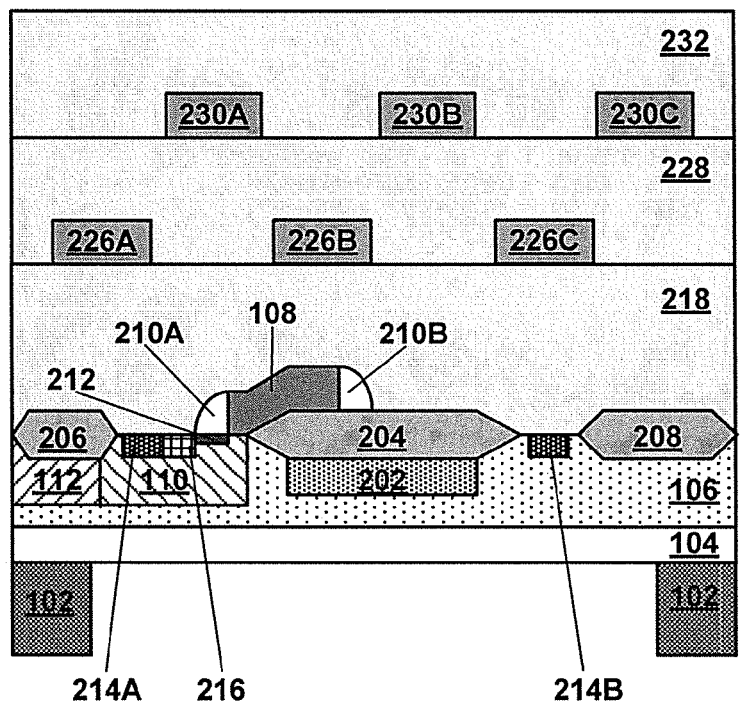
Figure 2L:
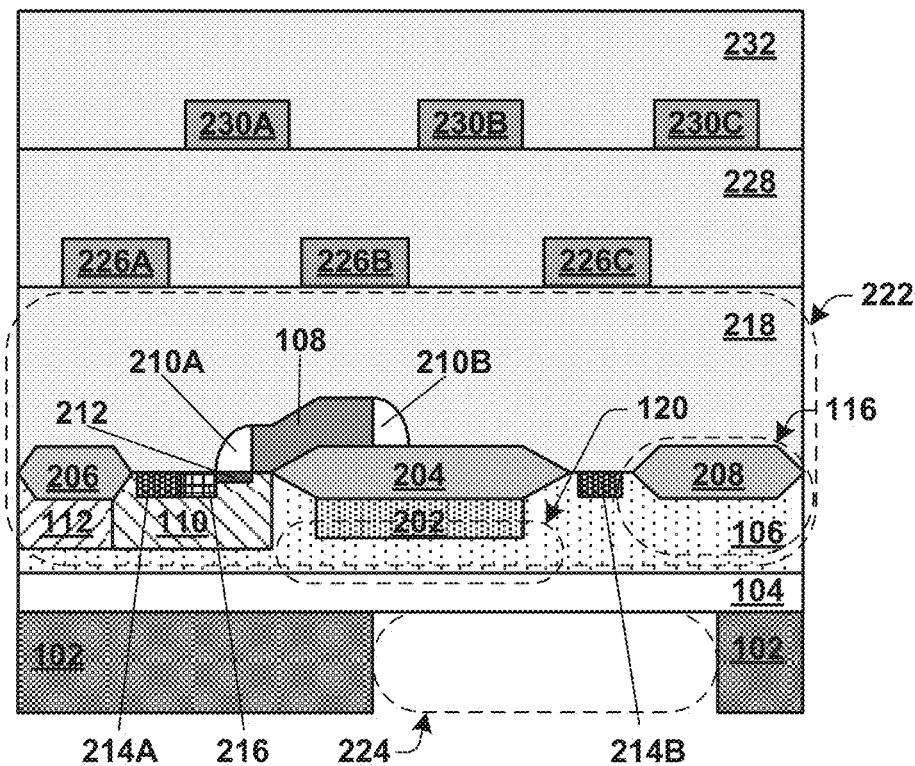

After selective removal of the handle wafer, the back end of line (BEOL) metallization is completed by forming a plurality of metallization levels to connect the power device to an external stimulus (i.e., voltage). FIG. 2K illustrates a power device 200K with BEOL layers added after recess (224) formation. Terminals of power device are isolated within the ILD 218 and coupled to first metallization layers 226A-226C, which are isolated from one another within an inter-metal dielectric (IMD) 228. The first metallization layers 226A-226C are coupled to second metallization layers 230A-230C, which are isolated from one another within a passivation (PA) layer 232. The embodiments of FIGS. 2A-2L illustrate full removal of a section of the handle wafer 102 below the power device 222. However, improved breakdown voltage may also be achieved through partial removal of the section of the handle wafer 102 below the power device 222, as illustrated in FIG. 2L, wherein the recess 224 forms below a drain region of the power device 222 and spans an n-drift region (not shown) between a channel region 120 of power device 222 and drain 116.

Figure 3A:
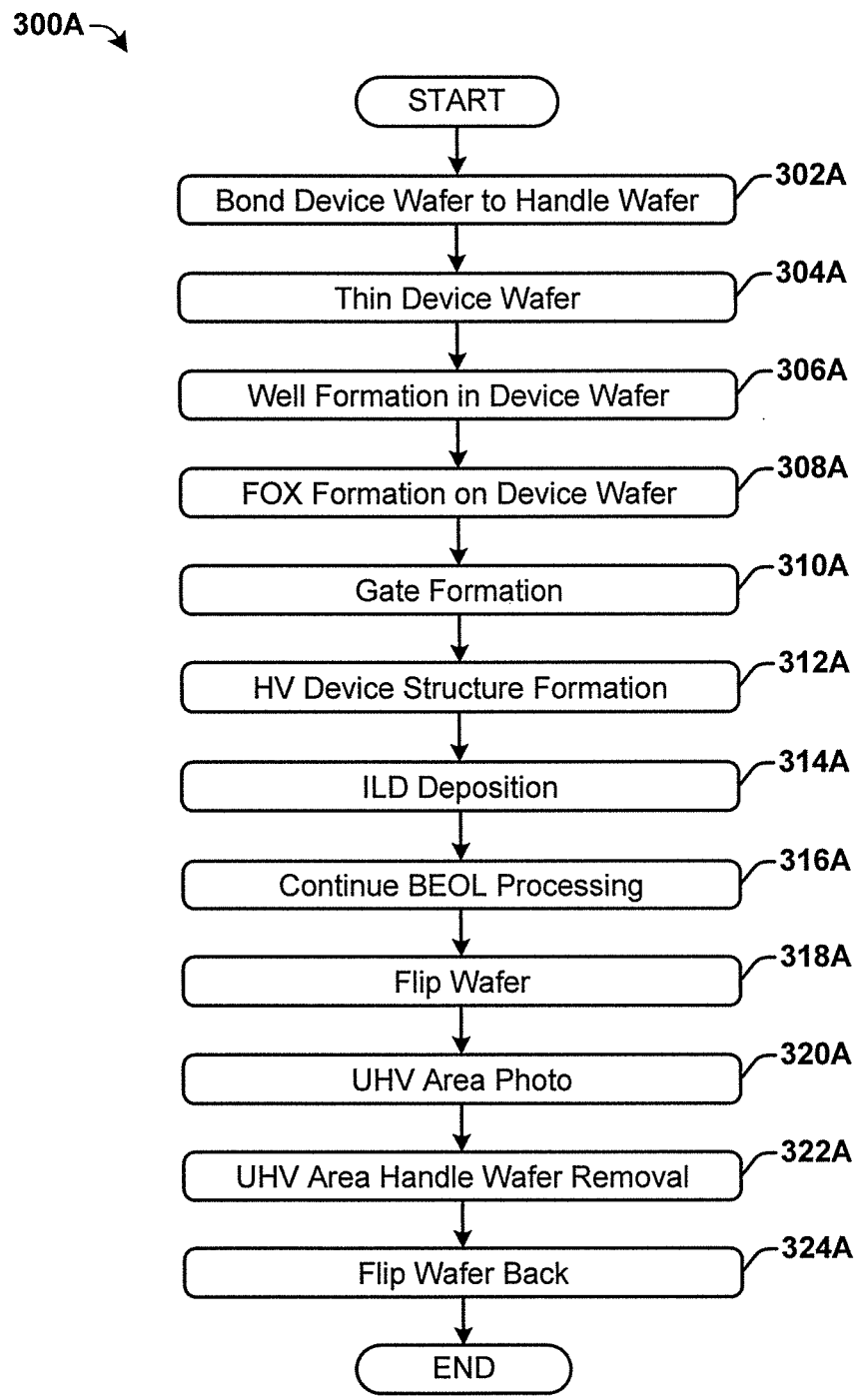
FIGS. 3A-3B illustrate some embodiments of a method of UHV power device fabrication.

FIG. 3A illustrates a flow chart of some embodiments of a method 300A of UHV power device fabrication. While method 300A is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302A a device wafer is bonded to a handle wafer with an intermediate oxide formed on the device wafer. In some embodiments the intermediate oxide comprises $SiO_2$ grown through a wet or dry chemical process which bonds a silicon handle wafer to a lightly-doped p-type device wafer.

At 304A the device wafer is thinned though a wet chemical etch process, dry chemical etch process, chemical mechanical polish (CMP), or a combination thereof from an original thickness of approximately 20 μm to a thickness of less than approximately 5 μm.

At 306A first source well is disposed within a surface region of the device wafer, the first source well comprising a conductivity type that is opposite that of the device wafer (e.g., for a lightly-doped p-type device wafer the first source well comprises an NWELL, and is formed through phosphorus implantation). A second source well comprising a PWELL is formed through boron implantation. A RESURF layer or p-ring is also formed through arsenic doping of a near surface region of the device wafer to reduce potential crowding under a gate material formed in a subsequent step.

At 308A a field oxide (FOX) is formed above source, drain, and gate regions of the device wafer. In some embodiments, FOX formation comprises epitaxial growth of a layer of Tetraethylorthosilicate (TEOS).

At 310A a gate material is disposed above a portion of the FOX layer formed in the gate region and over a portion the source well. Spacers are formed on either side of the gate to isolate the gate from the source and the drain. In some embodiments the gate material comprises an n+ poly. In other embodiments the gate material comprises a p+ poly.

At 312A the second source well is p+ doped in a first region which abuts the source FOX layer through ion implantation.

The second source well is n+ doped through on implantation in a second region which abuts the gate. The drain is also p+ doped in a near surface region.

At 314A an inter-layer dielectric (ILD) is formed to isolate the device wafer surface and power device from an ambient environment. The ILD also encapsulates source, drain, and gate contacts which connect the power device to BEOL metallization layers fabricated in subsequent steps.

At 316 BEOL metallization is completed by forming a plurality of metallization levels to connect the power device to an external stimulus. First metallization layers are disposed above the ILD and coupled to the power device terminals through contacts which are isolated from one another within an IMD. The first metallization layers are coupled to second metallization layers, which are isolated from one another within a PA layer. A chip connection coupled to the metallization levels is formed within the PA layer for the purpose of connecting the chip to an external stimulus (e.g., power, clocking, data, etc).

At 318A the bonded wafer is flipped over.

At 320A a surface of the handle wafer is patterned with respect to the UHV power device formed in the previous steps. The surface of the handle wafer is coated with photoresist and aligned with a photomask containing a pattern that comprises an opening above a section of the handle wafer surface over a portion of the UHV power device (i.e., a section of the handle wafer surface below a portion of the UHV power device in a regular orientation). The handle wafer surface is exposed to light to transfer the mask pattern to the photoresist.

At 322A the pattern is etched into the surface of the handle wafer using the intermediate oxide layer as an etch stop to create a recess within the handle wafer over the UHV power device. In some embodiments a section of the handle wafer is removed over the entire UHV power device. In some embodiments a section of the handle wafer is removed over a portion of the UHV power device (e.g. the drain).

At 324A the bonded wafer is flipped back to the regular orientation, wherein the recess resides below the UHV power device.

Figure 3B:
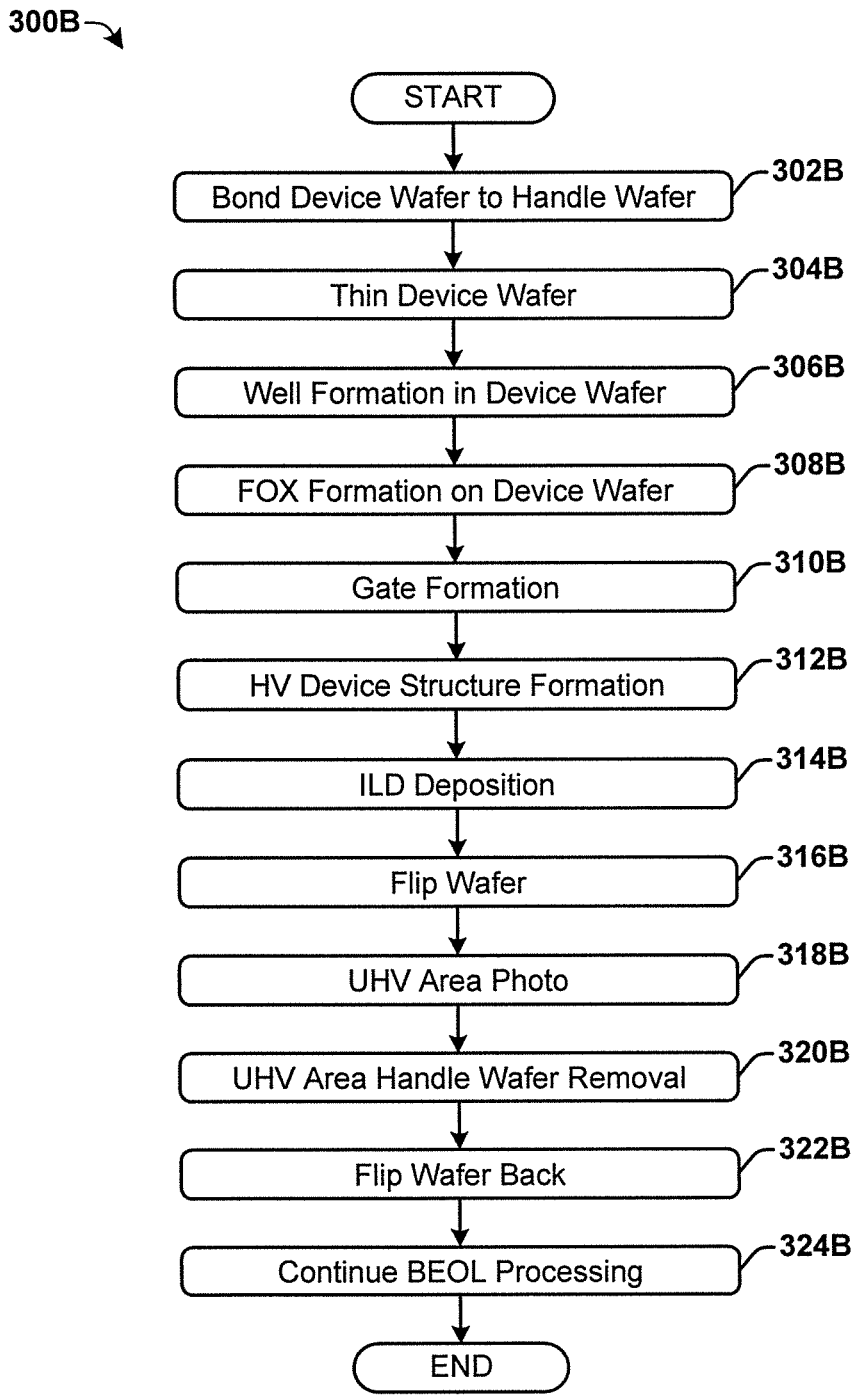

FIG. 3B illustrates a flow chart of some embodiments of a method 300B of UHV power device fabrication. Method 300B comprises the same steps as method 300A, but executes them in a different order to achieve an equivalent result, 302B-314B are identical to 302A-314A and executed in the same order such that there is no difference between method 300A and method 300B through the step of ILD deposition (314A/B). However, the remaining BEOL fabrication in method 300B is moved to the last step relative to method 300A. The remaining steps of method 300A are performed in the same order in method 300B (i.e., 316B-322B are performed after 314B, and in the same manner and order as in method 300A). After flipping the bonded wafer (316B), exposing patterned photoresist on the surface of the handle wafer to light (318B), removing sections of the handle wafer respective of the power device (320B), and flipping back (322B), the remaining BEOL fabrication is completed at 324B.

Figure 4A:
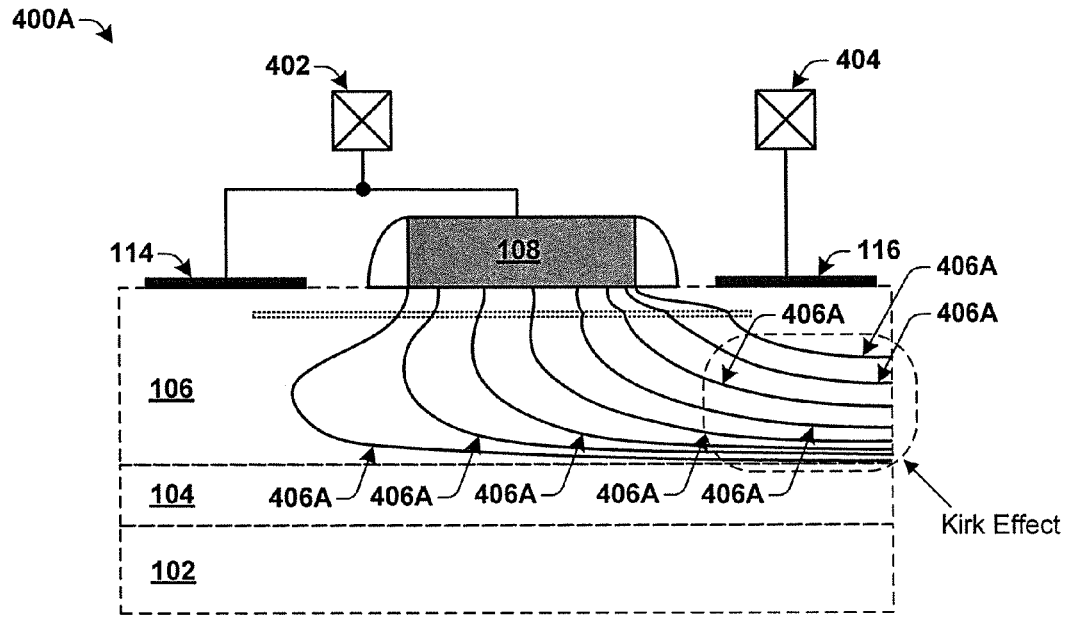
FIGS. 4A-4B illustrate some embodiments of a breakdown voltage measurement for power devices.

FIG. 4A illustrates some embodiments of a breakdown voltage measurement for a power device 400A formed on a bonded wafer. A gate 108 and a source 114 of the power device 400A are coupled to a ground pad 402. A drain 116 of the power device 400A is coupled to a power pad 404 which supplies a voltage to the power device 400A resulting in a reverse bias of power device 400A. Under these biasing conditions, a "RESURF effect" distributes electric potential lines 406A over a part of the power device 400A in a lateral direction towards the drain 116, and results in an optimal spreading of the electric potential lines 406A at breakdown. At high current-density potential crowding under the gate 108 will cause the electric potential lines 406A will shift towards the drain 116 due to a phenomena known as the "Kirk Effect," which is well-understood to one of ordinary skill in the art. Note that the power device 400A is disposed on a bonded wafer comprising a device wafer 106 with a thickness of approximately 20 micros bonded to a handle wafer 102 with an intermediate oxide layer 104 (e.g., $SiO_2$), wherein no section of the handle wafer 102 has been removed. Potential crowding occurs at an interface between the handle wafer 102 and the intermediate oxide layer 104, limiting the breakdown voltage of this measurement to approximately 465 V.

Figure 4B:
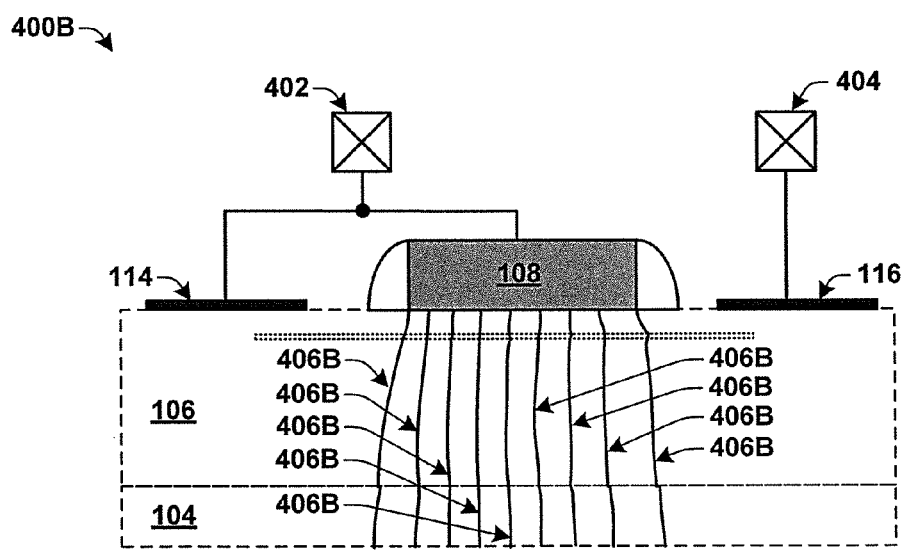

FIG. 4B illustrates some embodiments of a breakdown voltage measurement for a power device 400B formed on a bonded wafer, wherein a section of a handle wafer (102) below the power device 400B has been removed. Additionally, the device wafer 106 has been thinned to a thickness of approximately 5 μm. The biasing conditions of power device 400B are identical to those of power device 400A. However, the resulting electric potential lines 406B are emitted from the gate are distributed substantially more uniformly between the source 114 and the drain 116 than for the embodiments of FIG. 4A. In particular, no substantial potential crowding or substantial Kirk Effect is observed. Removal of the handle wafer (102) in conjunction with thinning the device wafer increases the breakdown voltage of the power device 400B to a value greater than approximately 500 V. In addition, a lateral component of electric potential lines 406A of FIG. 4A is substantially removed, resulting in essentially vertical electric potential lines 406B. The breakdown voltage of this embodiment is measured to be approximately 525 V.

Figure 5:
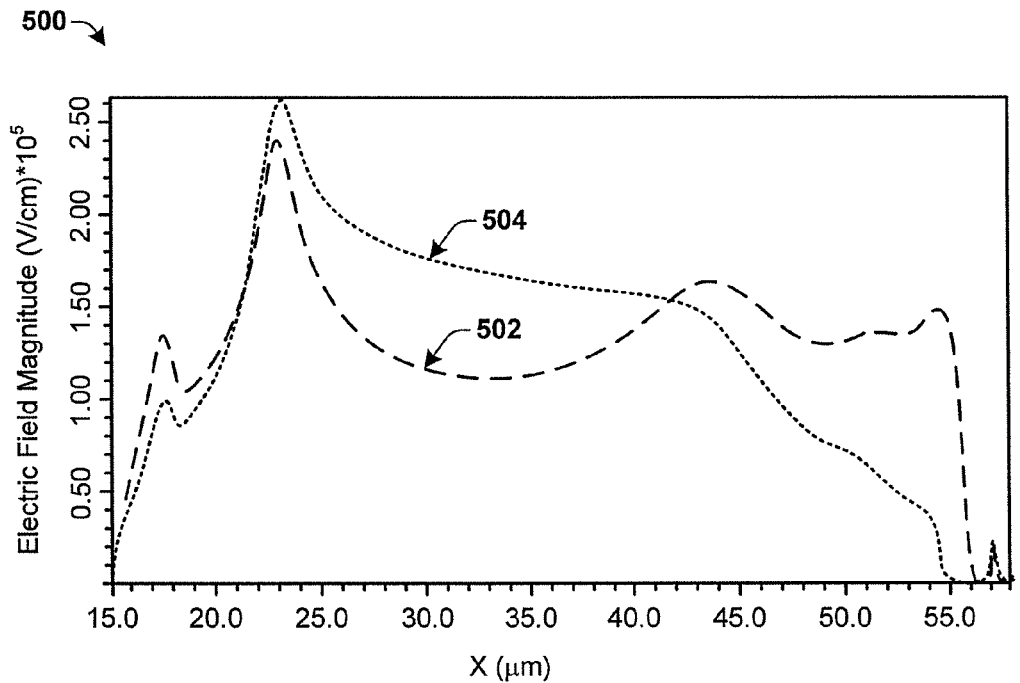
FIG. 5 illustrates a graph of an electric field distribution for power devices.

FIG. 5 illustrates a graph 500 of an electric field distribution for the power devices of the embodiments of FIGS. 4A-4B. The electric field magnitude in units of V/cm (i.e., ordinate) is shown as a function of depth within the bonded wafer in units of μm (i.e., the abscissa) for a first distribution curve 502 measured from the embodiments of FIG. 4A and a second distribution curve 504 measured from the embodiments of FIG. 4B. The area under each respective curve 502 or 504 yields the breakdown for the respective power device 400A or 400B. The area under the first distribution curve 502 yields a breakdown voltage of approximately 465 V. The area under the second distribution curve 504 yields a breakdown voltage of approximately 525 V.

Figure 6:
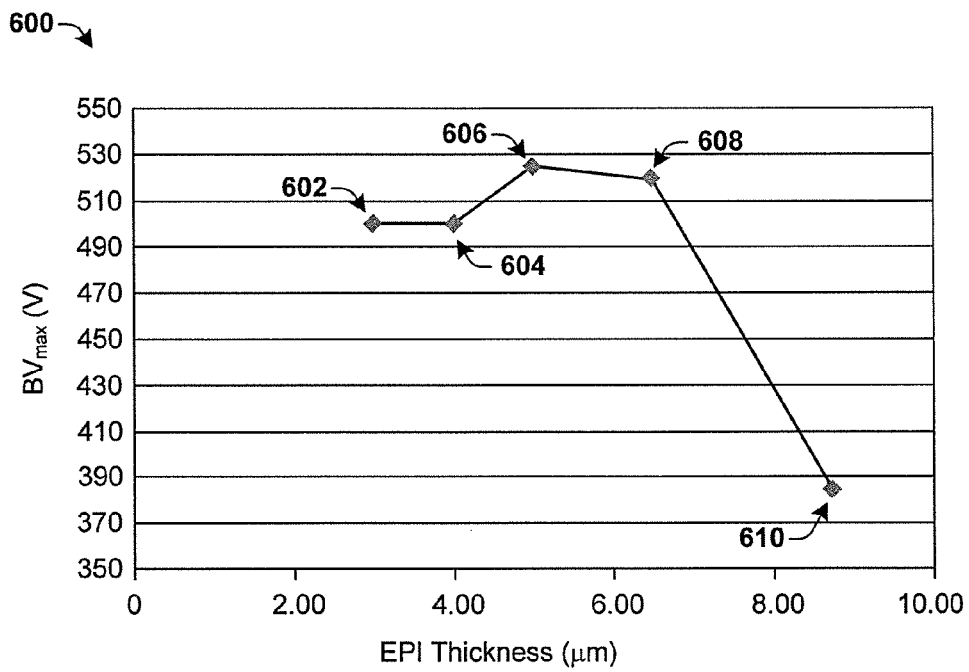
FIG. 6 illustrates a graph of breakdown voltage as a function of device wafer thickness for a power device.

Breakdown voltage improvement is thus demonstrated for a power device (e.g., LIGBT) on a bonded wafer wherein the surface of the handle wafer is selectively patterned to remove a section of the handle wafer below a portion of the power device, and wherein the device wafer has been thinned from an original thickness of approximately 20 μm. FIG. 6 illustrates a graph 600 of breakdown voltage as a function of device wafer thickness for a power device. Ordinate of graph 600 is a breakdown voltage for power device in V. Abscissa of graph 600 is device wafer thickness in μm for a device wafer comprising an epitaxial layer of silicon (i.e., epi). Data points 602-610 represent breakdown voltage measurements in accordance with the embodiments of FIGS. 4A-4B and FIG. 5 for various device wafer thicknesses. A first device wafer thickness of approximately 3 μm yields a first breakdown voltage value 602 of approximately 500 V, a second device wafer thickness of approximately 4 μm yields a second breakdown voltage value 604 of approximately 500 V, a third device wafer thickness of approximately 5 μm yields a third breakdown voltage value 606 of approximately 525 V, a fourth device wafer thickness of approximately 6.5 μm yields a fourth breakdown voltage value 602 of approximately 520

V, and a fifth device wafer thickness of approximately 8.75 μm yields a fifth breakdown voltage value 610 of approximately 385 V. Therefore, the embodiments of FIG. 6 illustrate a maximum breakdown voltage improvement to approximately 525 V for a device wafer thickness of approximately 5 μm.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and apparatus to increase breakdown voltage of a semiconductor power device. A bonded wafer is formed by bonding a device wafer to a handle wafer with an intermediate oxide layer. The device wafer is thinned substantially from its original thickness. A power device is formed within the device wafer through a semiconductor fabrication process. The handle wafer is patterned to remove section of the handle wafer below the power device, resulting in a breakdown voltage improvement for the power device as well as uniform electric potential between the source and drain of the power device.

In some embodiments the present disclosure relates to a method to increase breakdown voltage of a power device, comprising bonding a device wafer to a handle wafer with an intermediate oxide layer, fabricating a power device on the device wafer, and removing a section of the handle wafer below the power device. The removal of the handle wafer has an effect of mitigating potential crowding at an interface between the handle wafer and intermediate oxide, resulting in increased electric potential uniformity in a cannel region of the power device and a breakdown voltage improvement.

In some embodiments the present disclosure relates to a method of power device fabrication, comprising oxidizing a surface of a device wafer to create an intermediate oxide layer and bonding the device wafer to a handle wafer with the intermediate oxide layer. The wafer is thinned to a thickness of between approximately 2 μm and approximately 10 μm. A power device is fabricated on the device wafer and isolated from ambient conditions with an ILD layer. The surface of the handle wafer is selectively patterned to remove a section of the handle wafer below a portion of the power device. The combination of device wafer thinning and handle wafer removal increases the breakdown voltage value.

In some embodiments the present disclosure relates to a semiconductor device disposed on a thinned device wafer bonded to a handle wafer with an intermediate oxide layer, comprising source, drain, and gate terminals, and a recess formed in the handle wafer, wherein the handle has been removed directly below the semiconductor device.

What is claimed is:

1. A power device, comprising:
   a transistor disposed on a first surface of a device wafer and including a source region, a drain region, and a channel region which are laterally spaced apart over the first surface; and
   a handle wafer bonded to a second surface of the device wafer with an intermediate oxide layer, the handle wafer comprising: an un-recessed region having a first handle wafer thickness under the source region, and a recessed region having a second handle wafer thickness under both the channel region and the drain region, the second handle wafer thickness being less than the first handle wafer thickness.

2. The power device of claim 1, wherein the power device is isolated using the intermediate oxide layer.

3. The power device of claim 1, wherein the device wafer has a device wafer thickness of between approximately 2 μm and approximately 10 μm.

4. The power device of claim 1, wherein the transistor has a breakdown voltage of greater than approximately 500 V.

5. A semiconductor device disposed on a device wafer bonded to a handle wafer with an intermediate oxide layer, comprising:
   a first field oxide layer disposed above a source region of the semiconductor device;
   a second field oxide layer disposed above a drain region of the semiconductor device;
   a third field oxide layer disposed above a channel region and below a gate of the semiconductor device; and
   wherein the handle wafer comprises an un-recessed region having a first handle wafer thickness under the source region, and a recessed region having a second handle wafer thickness under both the channel region and the drain region, the second handle wafer thickness being less than the first handle wafer thickness.

6. The semiconductor device of claim 5, wherein the source region comprises:
   a first well comprising a first conductivity of a first type within the source of the semiconductor device;
   a second well comprising a second conductivity of a second type beneath the first field oxide adjacent the first well;
   a first doped region comprising an first excess of carriers of a first type disposed within the first well adjacent the first field oxide layer; and
   a second doped region comprising an second excess of carriers of a second type disposed within the first well between the gate and the first doped region.

7. The semiconductor device of claim 6, wherein:
   conductivity of the first type comprises p-type conductivity;
   conductivity of the second type comprises n-type conductivity;
   carriers of the first type comprise holes; and
   carriers of the second type comprise electrons.

8. The semiconductor device of claim 7, wherein the device wafer comprises an epitaxial layer of silicon between approximately 2 μm and approximately 10 μm thick.

9. The semiconductor device of claim 8, wherein the semiconductor device has a breakdown voltage of greater than approximately 500 V.

* * * * *